United States Patent
Park

(10) Patent No.: US 7,663,243 B2
(45) Date of Patent: Feb. 16, 2010

(54) SEMICONDUCTOR MEMORY DEVICE COMPRISING PSEUDO GROUND PAD AND RELATED METHOD

(75) Inventor: Jong-Mok Park, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 123 days.

(21) Appl. No.: 11/478,600

(22) Filed: Jul. 3, 2006

(65) Prior Publication Data

US 2007/0057377 A1 Mar. 15, 2007

(30) Foreign Application Priority Data

Sep. 15, 2005 (KR) .................... 10-2005-0086449

(51) Int. Cl.
*H01L 23/52* (2006.01)
(52) U.S. Cl. .................................. 257/773; 438/637
(58) Field of Classification Search ................. 257/773, 257/691, E23.153, E23.703, E23.001; 438/125, 438/129, 403, 637
See application file for complete search history.

(56) References Cited

U.S. PATENT DOCUMENTS 6,617,622 B2   9/2003   Kudou et al.

2001/0023981 A1*  9/2001  Ikumo et al. ................ 257/678
2006/0060986 A1*  3/2006  Kim et al. ................... 257/786
2007/0057377 A1*  3/2007  Park ........................... 257/773

FOREIGN PATENT DOCUMENTS

| JP | 59-023541 | * | 2/1984 |
| JP | 11-330356 | | 11/1999 |
| JP | 1020010057919 | | 7/2001 |

* cited by examiner

*Primary Examiner*—Steven Loke
*Assistant Examiner*—Kimberly M Thomas
(74) *Attorney, Agent, or Firm*—Volentine & Whitt, PLLC

(57) ABSTRACT

A semiconductor memory device comprising a pseudo ground voltage pad and a method of making the semiconductor device are disclosed. The semiconductor memory device comprises a plurality of pads that are respectively adjacent to one another in a first direction. The plurality of pads comprises a plurality of ground voltage pads and a plurality of data pads. The semiconductor memory device further comprises a first peripheral circuit ground line disposed adjacent to the pads and extending in the first direction, and an insulating layer formed on a portion of a first region of the semiconductor memory device comprising the plurality of pads and at least a portion of the first peripheral ground circuit line, wherein a region of the first peripheral circuit ground line is exposed to define a pseudo ground voltage pad, and the pseudo ground voltage pad is adjacent to one of the data pads.

18 Claims, 6 Drawing Sheets

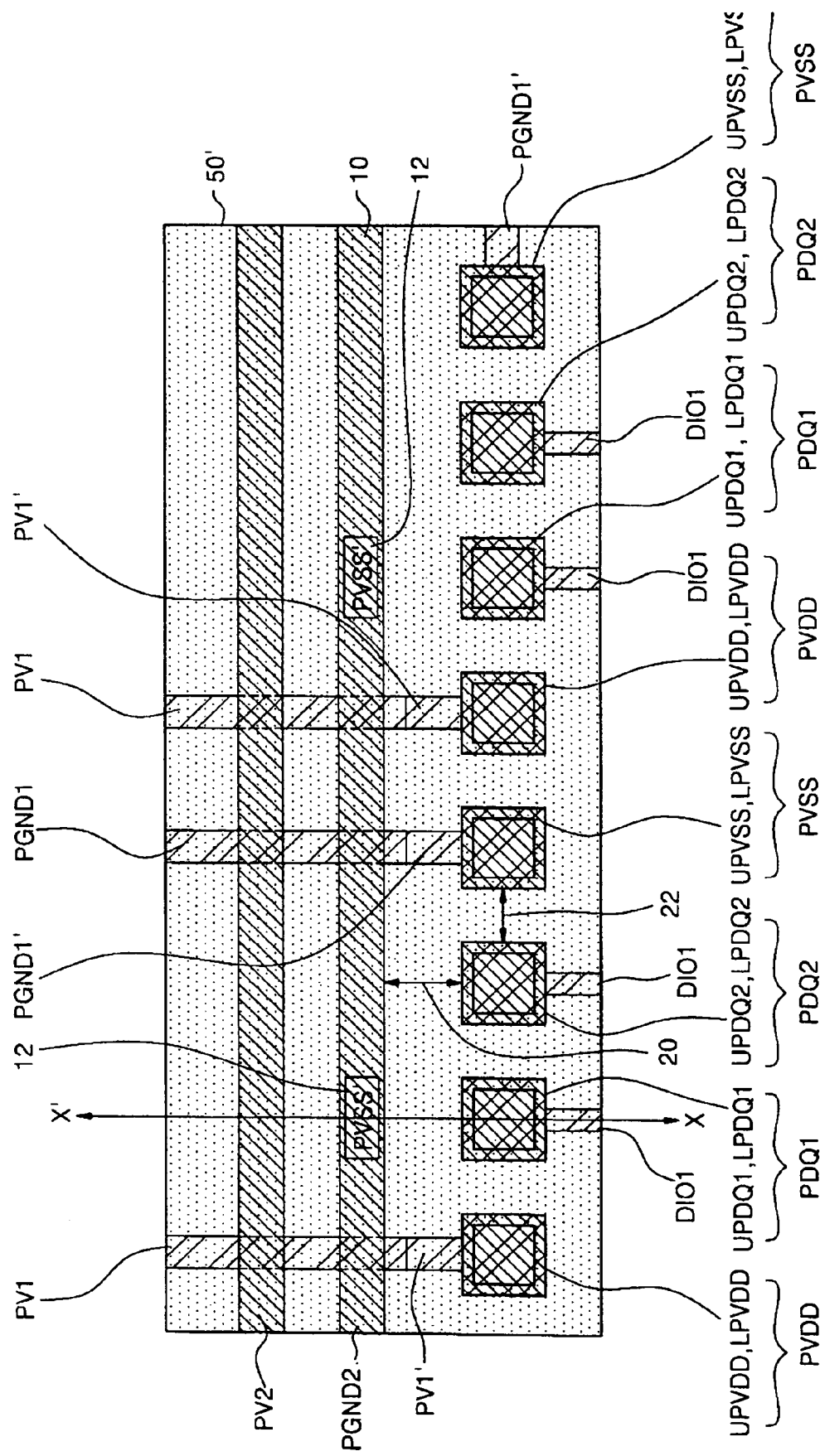

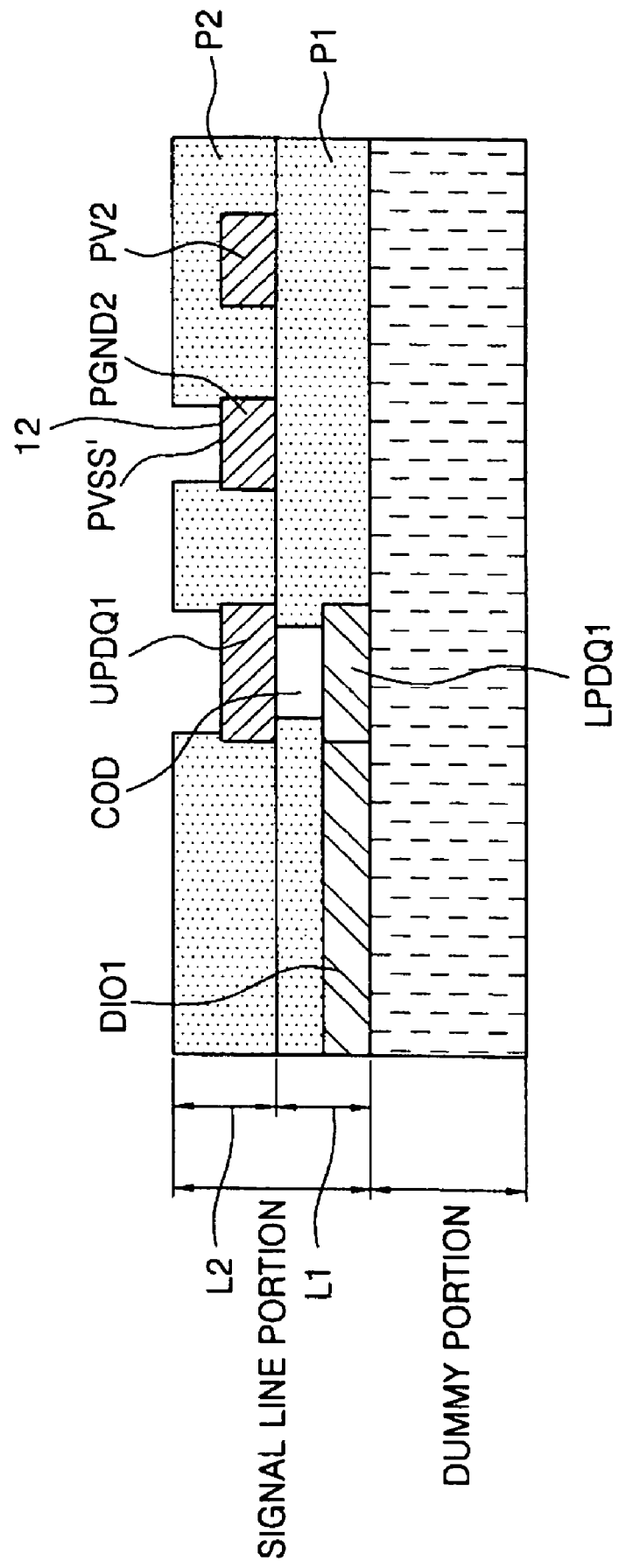

SEMICONDUCTOR MEMORY DEVICE COMPRISING PSEUDO GROUND PAD AND RELATED METHOD

BACKGROUND OF THE INVENTION

1. Field of the Invention

Embodiments of the invention relate to a semiconductor memory device. In particular, embodiments of the invention relate to a semiconductor memory device comprising a pseudo ground pad and a method of making the semiconductor memory device comprising the pseudo ground pad.

This application claims priority to Korean Patent Application No. 2005-86449, filed Sep. 15, 2005, the subject matter of which is hereby incorporated by reference in its entirety.

2. Description of the Related Art

Increased sophistication and specialization within the fabrication and provision of semiconductor devices, as well as increased diversity in the manner by which semiconductor devices are incorporated within various host devices have resulted in new demands upon the testing capabilities of the constituent semiconductor devices. Where once a great majority of semiconductor devices were powered for testing only after being incorporated into a package, many contemporary semiconductor devices must first be tested at the wafer level (i.e., before being cut from a wafer substrate). That is, an increased demand for wafer level testing necessitates changes in the test-related design and operation of semiconductor devices.

For example, one common test applied to semiconductor devices measures certain parasitic influences between circuit elements of the semiconductor device. While such parasitic influences are often distributed in nature, they are routinely modeled and/or expressed in terms of discrete parasitic elements. In one sense, these discrete parasitic elements may be viewed as "virtual" elements of the various circuits formed on a semiconductor device.

Such parasitic elements include parasitic capacitances C and parasitic resistances R that are commonly formed between adjacent signal (e.g., power, data, address, and/or control) lines. Such signal lines may be formed on the same or different material layers of a multi-layer semiconductor device. Parasitic capacitance and resistance elements are routinely present in coincidence and may be modeled as parasitic RC elements. In several effects, parasitic RC elements cause signal line propagation delays, increase the power consumption, and increase current leakage. Parasitic elements may be determined by calculating a reflective characteristic S11 of a data pad and a transfer characteristic S21 of a pair of differential data pads.

In accordance with a conventional method of measuring parasitic elements of a first data pad, a test device connects a probe tip to the first data pad and a corresponding ground voltage pad to calculate reflection characteristic S11 of the first data pad. Also, the test device uses a first probe tip of a pair of probe tips to connect a primary data pad to a corresponding ground voltage pad and uses a second probe tip of the pair of probe tips to connect a secondary data pad to a corresponding ground voltage pad, wherein the primary and secondary data pads are differential data pads (and one of the primary and secondary data pads is the first data pad), to calculate transfer characteristic S21 of the data pad.

The shape and size of the probe tip of the test device is fixed, so a data pad and a ground voltage pad can only be connected using a single probe tip when the data pad and the ground voltage pad are adjacent to one another in a semiconductor memory device.

However, in a conventional semiconductor memory device, a plurality of pads is arranged in a central region of the semiconductor memory device as shown in FIG. (FIG.) 1. In the conventional semiconductor memory device, pluralities of data pads, power supply voltage pads, and ground voltage pads are arranged to form lines, and in that arrangement not every data pad is adjacent to a ground voltage pad.

In other words, since less than all of the data pads are adjacent to a ground voltage pad, less than all of the data pads can be connected to the test device to calculate reflection characteristic S11 using the probe tip. In addition, the probability of having a pair of differential data pads wherein each data pad of the pair is adjacent to a ground voltage pad is also low, so the probability of being able to measure transfer characteristic S21 of a data pad using the test device connected to a pair of differential data pads and corresponding ground voltage pads is also low. That is, it is difficult to find data pads that can be used to measure transfer characteristic S21 in the conventional semiconductor-memory device.

Consequently, when a semiconductor memory device has a structure in which a plurality of pads are arranged in lines as shown in FIG. 1, the reflection characteristic cannot be measured for every data pad using the test device, and there are few data pads for which the transfer characteristic can be measured. Accordingly, the parasitic influences (i.e., the total of the parasitic elements) of the semiconductor memory device must be inferred from the reflection characteristic of a limited number of data pads, so the conventional semiconductor memory device cannot be reliably analyzed.

SUMMARY OF THE INVENTION

Embodiments of the invention provide a semiconductor memory device comprising a pseudo ground voltage pad and a method of making a semiconductor memory device comprising a pseudo ground voltage pad. Reflection and transfer characteristics of a data pad in a semiconductor memory device in accordance with the invention may be measured using the pseudo ground voltage pad when the data pad is not adjacent to a ground voltage pad.

In one embodiment, the invention provides a semiconductor memory device comprising a plurality of pads arranged in a first direction, the plurality of pads comprising a plurality of ground voltage pads and a plurality of data pads; and, a first peripheral circuit ground line disposed adjacent to the plurality of pads and extending in the first direction. The semiconductor memory device further comprises an insulating layer disposed on a portion of a first region of the semiconductor memory device comprising the plurality of pads and at least a portion of the first peripheral ground circuit line and disposed on a first region of the first peripheral circuit ground line, such that at least one second region of the first peripheral circuit ground line is exposed to define a pseudo ground voltage pad, wherein the pseudo ground voltage pad is adjacent to one of the plurality of data pads.

In another embodiment, the invention provides a method of fabricating a semiconductor memory device comprising a pseudo ground voltage pad. The method comprises forming a plurality of pads, wherein the plurality of pads comprises a plurality of ground voltage pads and a plurality of data pads; and, forming a peripheral circuit ground line adjacent to the plurality of pads. The method further comprises forming an insulating layer over a first region of the peripheral circuit ground line to expose at least one second region of the peripheral circuit ground line defining a pseudo ground voltage pad, wherein the pseudo ground voltage pad is adjacent to one of the plurality of data pads.

BRIEF DESCRIPTION OF THE DRAWINGS

Embodiments of the invention will be described herein with reference to the accompanying drawings, in which like reference symbols indicate like or similar elements. In the drawings:

FIG. 5 is a plan view showing a region of a semiconductor memory device in which pads and peripheral lines are arranged in accordance with the invention; and, FIG. 6 is a cross-sectional view taken along a line X-X' of the region illustrated in FIG. 5 in which pads and peripheral lines are arranged.

DESCRIPTION OF EMBODIMENTS

Embodiments of the invention provide a semiconductor memory device in which pseudo ground pads are formed on a ground line and adjacent to data pads that are not adjacent to ground pads. When pseudo ground pads are formed adjacent to data pads that are not adjacent to ground pads, a test device may connect a probe tip to the data pads that are not adjacent to ground pads so that the parasitic elements of those data pads may be measured.

Before embodiments of the inventive semiconductor memory device and related method are described, a conventional semiconductor memory device will be described to provide a technical context.

As used herein, when a first element is said to be "on" or "connected to" another element, the first element may be directly on or directly connected to the second element, respectively, or an intervening element(s) may be present. Additionally, terms such as "first," "second," etc., are used herein for convenience of description and do not limit the scope of the invention.

Figure 1:
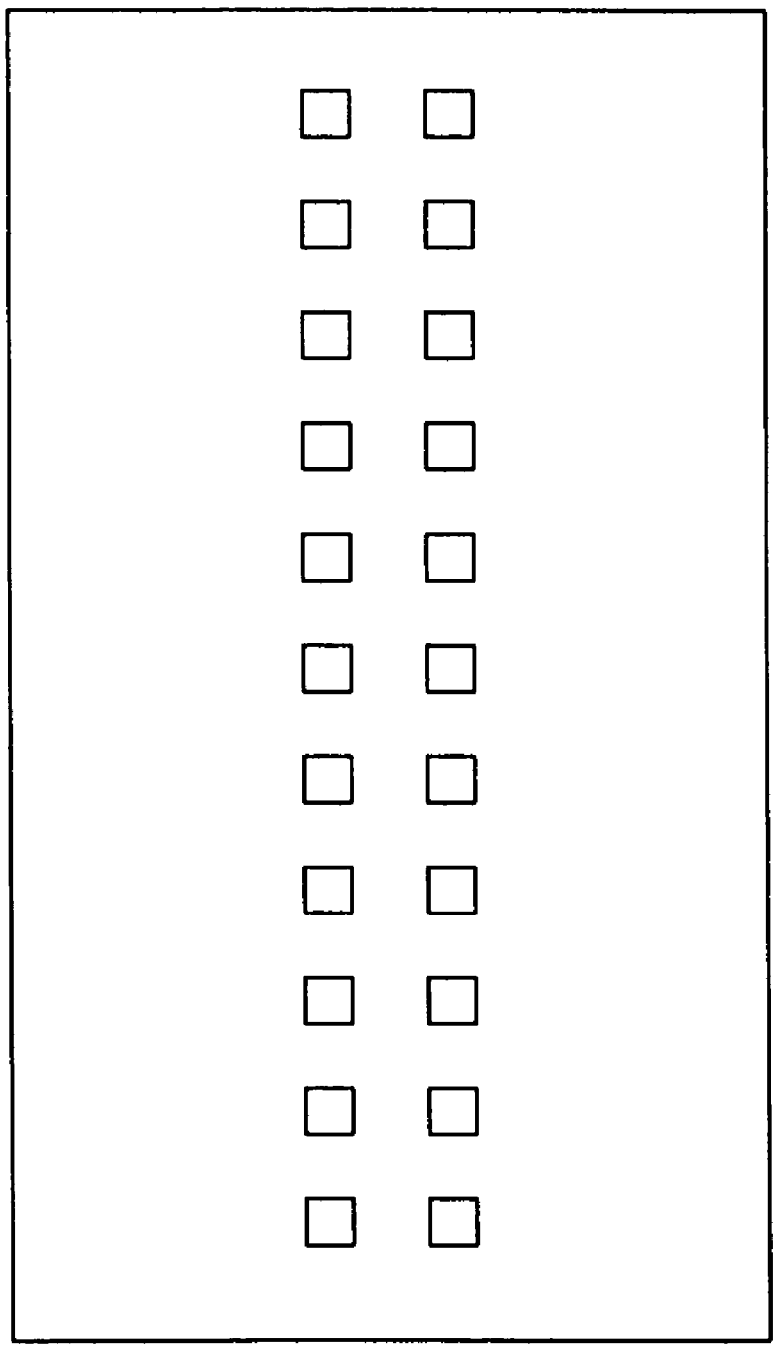
FIG. 1 is a diagram showing an arrangement of pads in a conventional semiconductor memory device.
Figure 2:
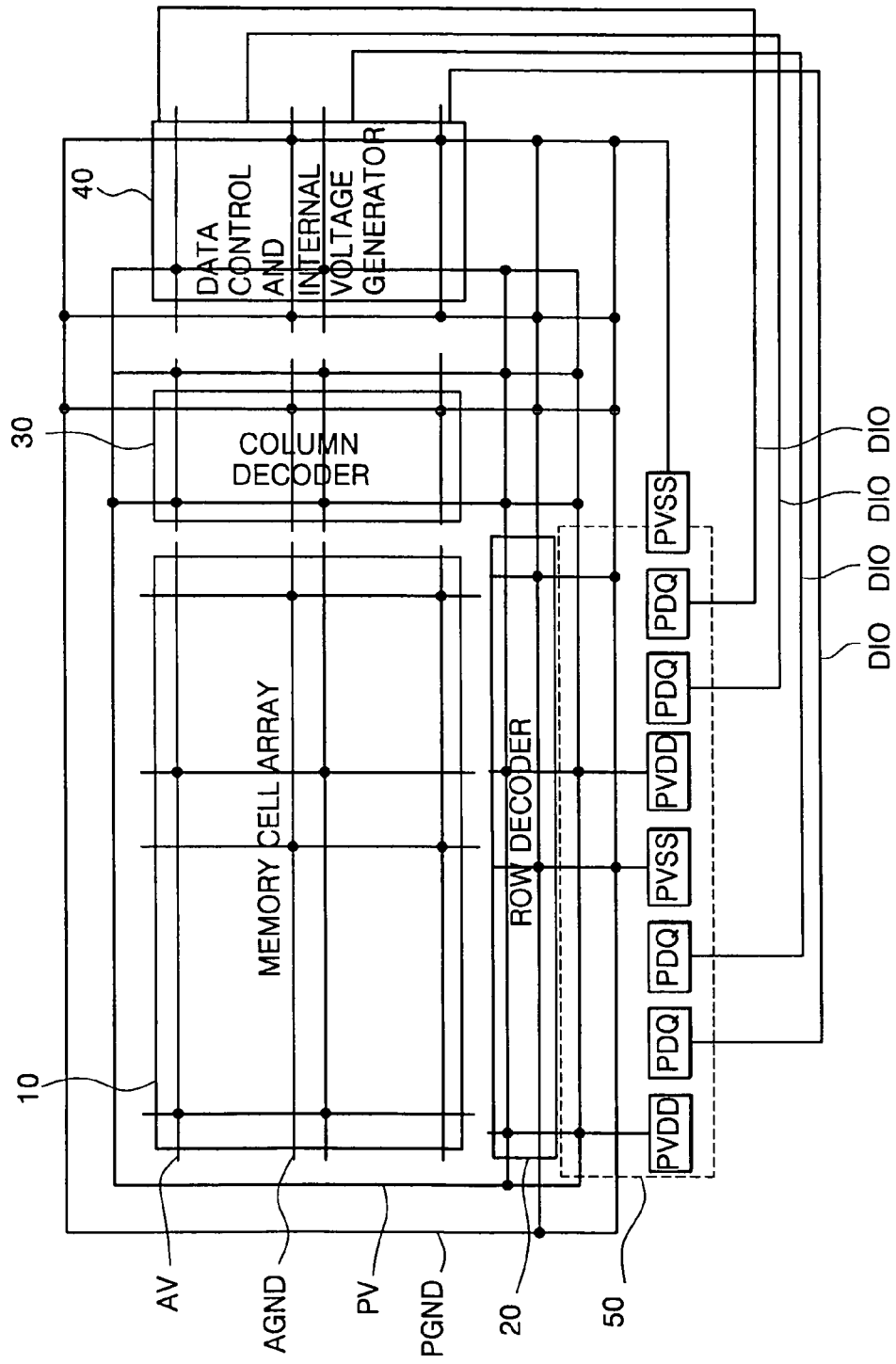
FIG. 2 is a schematic diagram showing the configuration of a region of a conventional semiconductor memory device.

FIG. 2 is a schematic diagram showing the configuration of a region of a conventional semiconductor memory device.

Referring to FIG. 2, the conventional semiconductor memory device comprises a memory cell array 10, a row decoder 20, a column decoder 30, and a data control and internal voltage generator 40.

In addition, the conventional semiconductor memory device comprises a power supply voltage pad PVDD, a ground voltage pad PVSS, and a data pad PDQ. The conventional semiconductor memory device further comprises an array power supply line AV, an array ground line AGND, a peripheral circuit power supply line PV, a peripheral circuit ground line PGND, and a data line DIO.

The arrangement and operation of the conventional semiconductor memory device shown in FIG. 2 will now be described.

Memory cell array 10 comprises a plurality of memory cells (not shown), and writes/reads data to/from a memory cell in response to a word line selection signal and a column selection signal. Row decoder 20 decodes a row address to generate the word line selection signal, and column decoder 30 decodes a column address to generate the column selection signal. In addition, data control and internal voltage generator 40 transfers data received from a plurality of data pads PDQ to memory cell array 10 during a write operation, and transfers data received from memory cell array 10 to the plurality of data pads PDQ while generating voltages having various levels to support the operation of the conventional semiconductor memory device during a read operation.

Array power supply lines AV and array ground lines AGND are disposed on memory cell array 10 in an array of rows and columns, and peripheral circuit power supply line PV and peripheral circuit ground line PGND are disposed on the peripheral circuit region in an array of rows and columns, so lines that transfer voltages of the same level are connected to one another.

As used herein, a "peripheral circuit region" comprises all areas of a semiconductor memory device except the area in which the memory cell array is disposed.

In the conventional semiconductor memory device, peripheral circuit power supply line PV and peripheral circuit ground line PGND may extend towards corresponding pads (i.e., power supply voltage pads PVDD and ground voltage pads PVSS, respectively), or the conventional semiconductor memory device may comprise an additional peripheral circuit power supply line PV and an additional peripheral circuit ground line PGND, wherein additional peripheral circuit power supply line PV and additional peripheral circuit ground line PGND are connected to power supply voltage pads PVDD and ground voltage pads PVSS, respectively. Thus, in the conventional semiconductor memory device, a peripheral circuit power supply line PV and a peripheral circuit ground line PGND are connected to power supply voltage pads PVDD and ground voltage pads PVSS, respectively.

In addition, data lines DIO connect data control and internal voltage generator 40 with data pads PDQ.

Also, in the conventional semiconductor memory device, peripheral circuit ground line PGND is disposed adjacent to and parallel to the straight line formed by the plurality of pads PVDD, PVSS, and PDQ.

Figure 3:
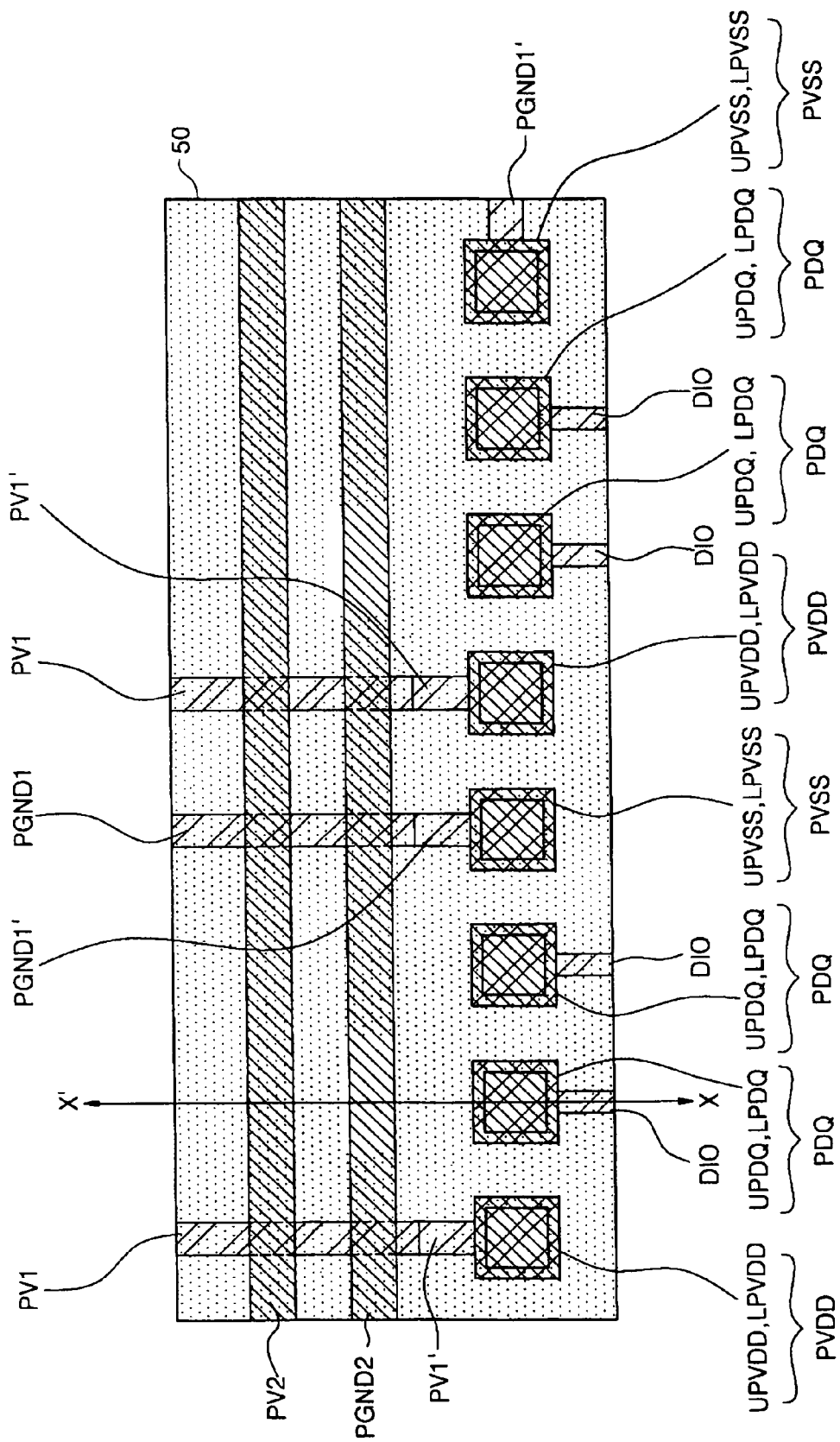
FIG. 3 is a plan view showing a region of the conventional semiconductor memory device of FIG. 2 in which pads and peripheral lines are arranged.
Figure 4:
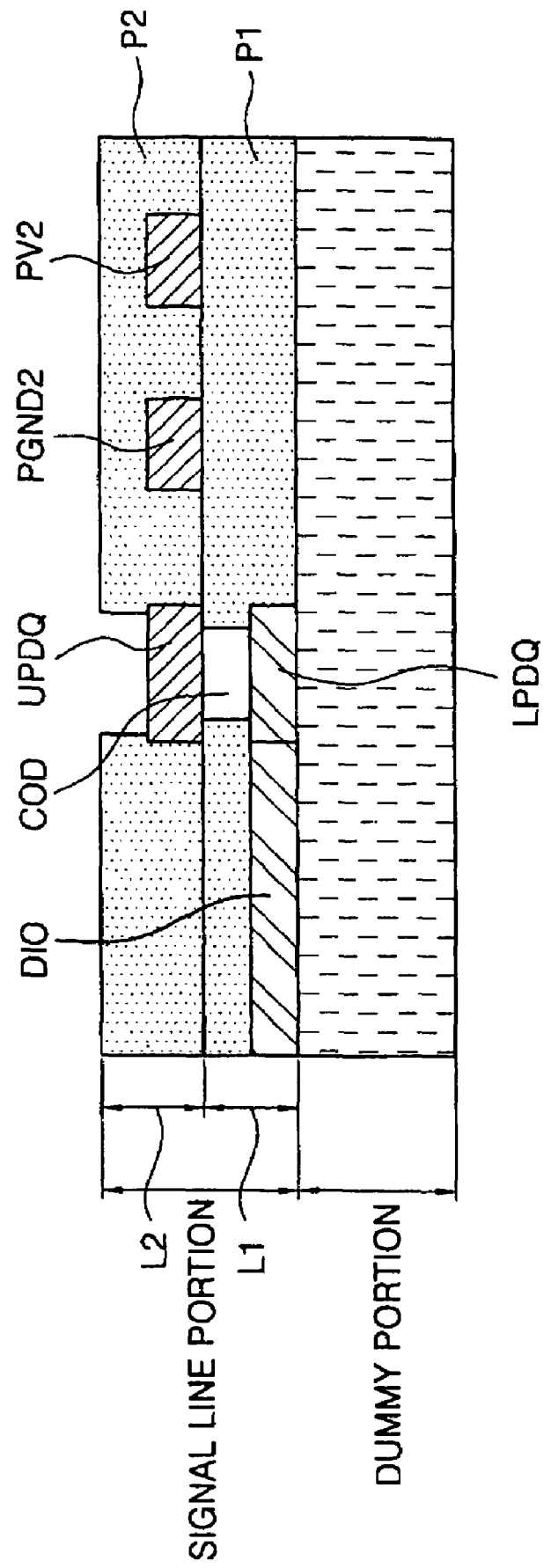
FIG. 4 is a cross-sectional view of the region shown in FIG. 3, wherein the cross-section is taken along a line X-X' of FIG. 3.

FIG. 3 is a plan view showing a region 50 of the conventional semiconductor device of FIG. 2 in which pads and peripheral lines are arranged, and FIG. 4 is a cross-sectional view of region 50 taken along a line X-X' of FIG. 3.

Referring to FIGS. 3 and 4, each pad PVDD, PVSS, and PDQ comprises a lower pad formed in a first layer and an upper pad formed in a second layer. In FIGS. 3 and 4, different types of cross-hatching are used to differentiate between pads and lines formed in the first layer and pads and lines formed in the second layer. Specifically, lines and pads whose cross-hatching comprises distinct pairs of oblique lines are formed in the first layer, and lines and pads whose cross-hatching comprises oblique lines that are not grouped into distinct pairs are formed in the second layer. In addition, layers P1 and P2 are insulating layers (i.e., first insulating layer P1 and second insulating layer P2).

The arrangement of pads and peripheral lines of the conventional semiconductor memory device of FIGS. 2 through 4 will now be described in more detail with reference to FIGS. 2 through 4.

In region 50 of the conventional semiconductor memory device, peripheral circuit power supply line PV and peripheral circuit ground line PGND are distributed in the peripheral circuit region in arrays of rows and columns, and peripheral circuit ground line PGND (i.e., PGND2) is parallel and adjacent to pads PVDD, PVSS, and PDQ.

Pads PVDD, PVSS, and PDQ comprise lower pads LPVDD, LPVSS, and LPDQ, respectively. Lower pads LPVDD, LPVSS, and LPDQ are formed in a first layer L1 and are arranged adjacent to one another to form a line straight line in a first direction (e.g., in a horizontal direction with respect to FIG. 3). As used herein, when pads are arranged to form a "straight line" it means that the pads are aligned along an abstract line, and not that the pads form an electrical line such as peripheral circuit ground line PGND. Peripheral circuit power supply lines PV1 and a peripheral circuit ground line PGND1 are disposed in a second direction (e.g., in a vertical direction with respect to FIG. 3). In the illustrated embodiment of FIG. 3, the first and second directions are orthogonal. In addition, each connecting line PV1' extends from a corresponding peripheral circuit power supply line PV1 to a corresponding power supply voltage pad PVDD to connect corresponding peripheral circuit power supply line PV1 to corresponding power supply voltage pad PVDD. Similarly, each connecting line PGND1' extends from a corresponding peripheral circuit ground line PGND1 to a corresponding ground voltage pad PVSS to connect corresponding peripheral circuit ground line PGND1 to corresponding ground voltage pad PVSS. In addition, connecting lines PV1' and PGND1' may extend in the first or second direction. Each data line DIO extends in the second direction and is connected to a corresponding data pad PDQ.

Pads PVDD, PVSS, and PDQ also comprise upper pads UPVDD, UPVSS, and UPDQ, respectively, which are disposed above lower pads LPVDD, LPVSS, and LPDQ, respectively, and are disposed in second layer L2. Thus, like lower pads LPVDD, LPVSS, and LPDQ, upper pads UPVDD, UPVSS, and UPDQ are also arranged adjacent to one another to form a straight line in the first direction. Additionally, a peripheral circuit power supply line PV2 and a peripheral circuit ground line PGND2 extend in the first direction; peripheral circuit ground line PGND2 is disposed adjacent to upper pads UPVDD, UPVSS, and UPDQ; and peripheral circuit power supply line PV2 is disposed adjacent to peripheral circuit ground line PGND2.

A second insulating layer P2 is formed in second layer L2 comprising an upper region and a lower region. Second insulating layer P2 is formed in portions of the upper and lower regions of second layer L2, but second insulating layer P2 does not completely cover upper pads UPVDD, UPVSS, and UPDQ, so portions of upper pads UPVDD, UPVSS, and UPDQ are exposed. That is, only inner regions of upper pads UPVDD, UPVSS, and UPDQ are exposed.

Referring to FIG. 4, region 50 of FIG. 3 comprises a dummy portion and a signal line portion, and the signal line portion comprises a first layer L1 and a second layer L2. Lower data pad LPDQ and data line DIO connected to lower data pad LPDQ are disposed in first layer L1, and upper data pad UPDQ and peripheral circuit ground line PGND2 adjacent to upper data pad UPDQ are disposed in second layer L2. A first insulating layer P1 is disposed in first layer L1 and is adapted to substantially insulate pads and lines disposed in first layer L1 from pads and lines disposed in second layer L2. However, a conductive layer COD is disposed in first layer L1 and penetrates a portion of insulating layer P1 disposed between lower data pad LPDQ and upper data pad UPDQ to connect lower data pad LPDQ and upper data pad UPDQ. Also, second insulating layer P2 is disposed in portions of the upper and lower regions of second layer L2, but second insulating layer P2 is not disposed on an inner portion of upper data pad UPDQ.

The dummy portion of region 50 (of FIG. 3) comprises a dummy diffusion layer, an insulating layer, and a dummy polysilicon layer to match a step between (i.e., to substantially eliminate the difference in height between) memory cell array 10 and peripheral circuits 20, 30, and 40.

As described above, only portions of upper pads UPVDD, UPVSS, and UPDQ are exposed in the conventional semiconductor memory device, so only upper pads UPVDD, UPVSS, and UPDQ may be connected to an external device.

Now that a conventional semiconductor memory device has been described with reference to FIGS. 2 through 4, embodiments of the invention will now be described with reference to FIGS. 5 and 6.

In accordance with an embodiment of the invention, as shown in FIGS. 5 and 6, the semiconductor memory device of FIG. 5 comprises a plurality of pads PVDD, PVSS, PDQ1, and PDQ2. The plurality of pads PVDD, PVSS, PDQ1, and PDQ2 comprises a plurality of power supply voltage pads PVDD, a plurality of ground voltage pads PVSS, and a plurality of data pads PDQ1, PDQ2. The plurality of data pads PDQ1, PDQ2 comprises a plurality of first data pads PDQ1 and a plurality of second data pads PDQ2, wherein each of first data pads PDQ1 is not adjacent to a ground voltage pad PVSS and each of second data pads PDQ2 is adjacent to a ground voltage pad PVSS.

In addition, peripheral circuit ground line PGND2 is parallel and adjacent to pads PVDD, PVSS, PDQ1, and PDQ2, and a first region 10 of peripheral circuit ground line PGND2, is covered by second insulating layer P2. Also, second regions 12 of peripheral circuit ground line PGND2 are exposed to form pseudo ground voltage pads PVSS', wherein pseudo ground voltage pads PVSS', when formed in the appropriate places in a semiconductor memory device, make it possible to measure the parasitic elements of all data pads PDQ1, PDQ2 in the semiconductor memory device.

That is, in accordance with an embodiment of the invention, second regions 12 of peripheral circuit ground line PGND2 are exposed to form pseudo ground voltage pads PVSS', wherein pseudo ground voltage pads PVSS' are respectively adjacent to first data pads PDQ1. In a semiconductor memory device comprising pseudo ground voltage pads PVSS' adjacent to first data pads PDQ1, a probe tip of a test device may be connected to a first data pad PDQ1 and a corresponding (i.e., adjacent) pseudo ground voltage pad PVSS' to measure the parasitic elements of first data pad PDQ1. Thus, the parasitic elements of first data pad PDQ1 may be measured even though first data pad PDQ1 is not adjacent to a ground voltage pad PVSS. That is, even when the probe tip of a test device cannot be connected to first data pad PDQ1 and an adjacent ground voltage pad PVSS because first data pad PDQ1 is not adjacent to a ground voltage pad PVSS, the parasitic elements of first data pad PDQ1 may still be measured in a semiconductor memory device in accordance with an embodiment of the invention using an adjacent pseudo ground voltage pad PVSS'.

FIGS. 5 and 6 are views illustrating an arrangement of pads and peripheral lines, wherein the arrangement comprises pseudo ground pads in accordance with an embodiment of the invention. Specifically, FIG. 5 is a plan view showing a region 50' in which pads and peripheral lines are arranged, and FIG. 6 is a cross-sectional view taken along line X-X' of region 50' of FIG. 5. Region 50' of FIGS. 5 and 6 is similar to region 50 of FIGS. 2 through 4 except that region 50' comprises pseudo ground pads PVSS'.

Referring to FIGS. 5 and 6, each of pads PVDD, PVSS, PDQ1, and PDQ2 comprises a lower pad disposed in a first layer L1 and an upper pad disposed in a second layer L2, and different types of cross-hatching are used to differentiate between pads and lines formed in the first layer and pads and lines formed in the second layer in the same way described with reference to FIGS. 3 and 4. Additionally, layers P1 and P2 are insulating layers.

An arrangement of pads and lines comprising pseudo ground voltage pads PVSS', in accordance with an embodiment of the invention, will now be described with reference to FIG. 5.

Pads PVDD, PVSS, PDQ1, and PDQ2 comprise lower pads LPVDD, LPVSS, LPDQ1, and LPDQ2. Lower pads LPVDD, LPVSS, LPDQ1, and LPDQ2 are formed in a first layer L1 and are arranged adjacent to one another to form a straight line in a first direction (e.g., in a horizontal direction with respect to FIG. 5). Peripheral circuit power supply lines PV1 and a peripheral circuit ground line PGND1 are disposed in a second direction (e.g., in a vertical direction with respect to FIG. 5). In the illustrated embodiment of FIG. 5, the first and second directions are orthogonal. In addition, each connecting line PV1' extends from a corresponding peripheral circuit power supply line PV1 to a corresponding power supply voltage pad PVDD to connect corresponding peripheral circuit power supply line PV1 to corresponding power supply voltage pad PVDD. Similarly, each connecting line PGND1' extends from a corresponding peripheral circuit ground line PGND1 to a corresponding ground voltage pad PVSS to connect corresponding peripheral circuit ground line PGND1 to corresponding ground voltage pad PVSS. In addition, connecting lines PV1' and PGND1' may extend in the first or second direction. Each data line DIO1 extends in the second direction and is connected to a corresponding first data pad PDQ1 or second data pad PDQ2.

Pads PVDD, PVSS, PDQ1, and PDQ2 also comprise upper pads UPVDD, UPVSS, UPDQ1, and UPDQ2, which are disposed above lower pads LPVDD, LPVSS, LPDQ1, and LPDQ2, respectively, and disposed in second layer L2. Thus, like lower pads LPVDD, LPVSS, LPDQ1, and LPDQ2, upper pads UPVDD, UPVSS, UPDQ1, and UPDQ2 are also are arranged adjacent to one another to form a straight line in the first direction. Additionally, a peripheral circuit power supply line PV2 and a peripheral circuit ground line PGND2 extend in the first direction; peripheral circuit ground line PGND2 is disposed adjacent to upper pads UPVDD, UPVSS, UPDQ1, and UPDQ2; and peripheral circuit power supply line PV2 is disposed adjacent to peripheral circuit ground line PGND2. In the illustrated embodiment of FIG. 5, peripheral circuit ground line PGND2 is preferably disposed such that a first separation distance 20 between peripheral circuit ground line PGND2 and any one of pads PVDD, PVSS, PDQ1, and PDQ2 is substantially the same as a second separation distance 22 between any two adjacent pads of pads PVDD, PVSS, PDQ1, and PDQ2. As used herein, a "separation distance" between two elements is the shortest distance between the two elements.

As illustrated in FIG. 5, peripheral circuit ground line PGND2 is disposed above PGND1. However, in another embodiment of the invention, peripheral circuit ground line PGND1 may be disposed above PGND2.

A second insulating layer P2 is formed in portions of upper and lower regions of second layer L2, but second insulating layer P2 does not cover inner portions upper pads UPVDD, UPVSS, UPDQ1, and UPDQ1; and also does not cover regions 12 of peripheral circuit ground line PGND2. So, inner portions of upper pads UPVDD, UPVSS, UPDQ1, and UPDQ2 remain exposed; and regions 12 of peripheral circuit ground line PGND2 remain exposed, defining pseudo ground voltage pads PVSS'.

Region 50' of FIG. 5 comprises a plurality of data pads PDQ1, PDQ2 comprising a plurality of first data pads PDQ1, wherein each first data pad PDQ1 is not adjacent to a ground voltage pad PVSS, and a plurality of second data pads PDQ2, wherein each second data pad PDQ2 is adjacent to a ground voltage pad PVSS. In the illustrated embodiment of FIG. 5, pseudo ground voltage pads PVSS' are only adjacent to first data pads PDQ1.

Alternatively, pseudo ground voltage pads PVSS' may also be adjacent to second data pads PDQ2. In another embodiment, each one of first and second data pads PDQ1 and PDQ2 may be adjacent to a pseudo ground voltage pad PVSS'.

In addition, upper pads UPVDD, UPVSS, UPDQ1, and UPDQ2 are not completely exposed, but rather only inner regions of upper pads UPVDD, UPVSS, UPDQ1, and UPDQ2 are exposed, as is shown in FIGS. 5 and 6. That is, second insulating layer P2 is formed on outer regions of the upper surfaces of each of upper pads UPVDD, UPVSS, UPDQ1, and UPDQ2.

FIG. 6 is a cross-sectional view taken along line X-X' of region 50' of FIG. 5, wherein region 50' comprises a dummy portion and a signal line portion. Also, FIG. 6 shows a first data pad PDQ1 (i.e., UPDQ1 and LPDQ1), peripheral lines PGND2 and PV2, and a pseudo ground pad PVSS'.

The signal line portion of region 50' comprises a first layer L1 and a second layer L2. A lower first data pad LPDQ1 and data line D101 connected to lower first pad LPDQ1 are disposed in first layer L1, and upper first data pad UPDQ1 and peripheral circuit ground line PGND2 adjacent to upper first data pad UPDQ1 are disposed in second layer L2. A first insulating layer P1 is disposed in first layer L1 and is adapted to substantially insulate pads and lines disposed in first layer L1 from pads and lines disposed in second layer L2. However, a conductive layer COD is disposed in first layer L1 and penetrates the portion of insulating layer P1 disposed between lower first data pad LPDQ1 and upper first data pad UPDQ1 to connect lower first data pad LPDQ1 and upper first data pad UPDQ1. Conductive layer COD is formed through a contact formation technique, which is a part of a semiconductor fabrication process.

The dummy portion of region 50' comprises of a dummy diffusion layer, an insulating layer, and a dummy polysilicon layer to match a step between (i.e., eliminate the difference in height between) memory cell array 10 and peripheral circuits 20, 30, and 40 (of FIG. 2).

Second insulating layer P2 is disposed in portions of upper and lower regions of second layer L2. Particularly, second insulating layer P2 covers first region 10 of peripheral circuit ground line PGND2. However, second layer L2 does not completely cover upper first data pad UPDQ1 and does not cover second region 12 of peripheral circuit ground line PGND2, wherein region 12 of peripheral circuit ground line PGND2 is adjacent to upper first data pad UPDQ1. That is, insulating layer P2 is formed such that a portion (i.e., second region 12) of peripheral circuit ground line PGND2 is exposed to form a pseudo ground voltage pad PVSS' and the portion of peripheral circuit ground line PGND2 that is exposed (i.e., second region 12) is adjacent to upper data pad UPDQ.

A method of fabricating a semiconductor memory device comprising a pseudo ground voltage pad PVSS' will now be described with reference to FIG. 5. The method comprises forming the plurality of pads PVDD, PVSS, PDQ1, and PDQ2 adjacent to one another to form a straight line, wherein the plurality of pads PVDD, PVSS, PDQ1, and PDQ2 are formed such that adjacent pads of the plurality of pads PVDD, PVSS, PDQ1, and PDQ2 are separated by second separation distance 22.

The method further comprises forming peripheral circuit ground line PGND2 adjacent to the plurality of pads PVDD, PVSS, PDQ1, and PDQ2 and parallel to the straight line formed by the plurality of pads PVDD, PVSS, PDQ1, and PDQ2. Peripheral circuit ground line PGND2 is formed such that it is separated from each of the plurality of pads PVDD, PVSS, PDQ1, and PDQ2 by first separation distance that is substantially the same as the first separation distance 20.

An insulating layer is then formed over a first region 10 of peripheral circuit ground line PGND2, leaving second regions 12 of peripheral circuit ground line PGND2 exposed to define pseudo ground voltage pads PVSS'. In the illustrated embodiment of FIG. 5, pseudo ground voltage pads PVSS' are formed such that they are only adjacent to first data pads PDQ1. Pseudo ground voltage pads PVSS' may also be formed such that they are also adjacent to second data pads PDQ2. In another embodiment, pseudo ground voltage pads PVSS' may be formed such that each one of first and second data pads PDQ1 and PDQ2 is adjacent to a pseudo ground voltage pad PVSS'.

In a semiconductor memory device in accordance with an embodiment of the invention, regions 12 of ground line PGND2, which are adjacent to data pads PDQ1, PDQ2, are exposed to form pseudo ground voltage pads PVSS' such that each of data pads PDQ1, PDQ2 is disposed adjacent to a ground voltage pad PVSS or a pseudo ground voltage pad PVSS'.

Thus, in the semiconductor memory device in accordance with an embodiment of the invention, for each one of data pads PDQ1, PDQ2, a probe tip of a test device may be connected to a data pad (i.e., a first data pad PDQ1 or a second data pad PDQ2) and a corresponding ground voltage pad PVSS or pseudo ground voltage pad PVSS' adjacent to the data pad; and thus, the test device may readily calculate the reflection characteristic S11 and the transfer characteristic S21 of each one of data pads PDQ1, PDQ2, thereby making it possible to measure the parasitic elements of each data pad in the semiconductor memory device.

A semiconductor memory device in accordance with an embodiment of the invention may comprise a ground voltage pad or a pseudo ground voltage pad adjacent to every data pad so that reflection characteristics and transfer characteristics of all data pads may be calculated. Likewise, a method of making a pseudo ground voltage pad in accordance with an embodiment of the invention may comprise forming a ground voltage pad or a pseudo ground voltage pad adjacent to every data pad so that reflection characteristics and transfer characteristics of all data pads may be calculated. Accordingly, in a semiconductor memory device in accordance with an embodiment invention, parasitic elements of all data pads may be measured. Thus, reliable analysis and evaluation of the semiconductor memory device may be performed.

Although embodiments of the invention have been described herein, various changes in the form and details of the embodiments may be made by one of ordinary skill in the art without departing from the scope of the invention as defined by the accompanying claims.

What is claimed is:

1. A semiconductor memory device comprising:
   a plurality of pads arranged in a first direction, the plurality of pads comprising a plurality of ground voltage pads and a plurality of data pads;
   a first peripheral circuit ground line laterally adjacent to each pad of the plurality of pads and extending in the first direction; and,
   an insulating layer disposed on a first region of each pad of the plurality of pads, exposing a second region of each pad of the plurality of pads, disposed on a first region of the first peripheral circuit ground line, and exposing a second region of the first peripheral circuit ground line, wherein the exposed second region of the first peripheral circuit ground line is a pseudo ground voltage pad disposed adjacent to one of the plurality of data pads.

2. The device of claim 1, wherein:
   the insulating layer exposes a plurality of second regions of the first peripheral circuit ground line to define a plurality of pseudo ground voltage pads; and,
   the plurality of data pads comprises a plurality of first data pads and a plurality of second data pads, wherein each of the first data pads is not adjacent to any one of the plurality of ground voltage pads and each of the second data pads is adjacent to at least one of the plurality of ground voltage pads.

3. The device of claim 2, wherein each of the first data pads is adjacent to at least one of the plurality of pseudo ground voltage pads.

4. The device of claim 3, wherein at least one of the second data pads is adjacent to at least one of the plurality of pseudo ground voltage pads.

5. The device of claim 2, wherein every one of the first and second data pads is adjacent to at least one of the plurality of pseudo ground voltage pads.

6. The device of claim 1, wherein a first separation distance between the first peripheral circuit ground line and one of the plurality of pads is substantially the same as a second separation distance between adjacent ones of the plurality of pads.

7. The device of claim 1, further comprising:
   a second peripheral circuit ground line; wherein,
   each ground voltage pad comprises a lower ground voltage pad, and an upper ground voltage pad disposed on the lower ground voltage pad, and
   at least one of the lower ground voltage pad and the upper ground voltage pad is connected to the second peripheral circuit ground line.

8. The device of claim 7, wherein the insulating layer is disposed on an outer region of the upper ground voltage pad.

9. The device of claim 1, wherein each one of the plurality of data pads comprises a lower data pad, and an upper data pad disposed on the lower data pad, wherein the lower data pad is connected to a data line.

10. The device of claim 1, further comprising:
    a peripheral circuit power supply line; wherein,
    the plurality of pads further comprises a plurality of power supply voltage pads, each power supply voltage pad comprising a lower power supply voltage pad, and an upper power supply voltage pad disposed on the lower power supply voltage pad, wherein the lower power supply voltage pad is connected to the peripheral circuit power supply line.

11. The device of claim 1, wherein the insulating layer is disposed on an outer region of each one of the plurality of pads.

12. The device of claim 1, further comprising:
    a second peripheral circuit ground line, wherein the first peripheral circuit ground line is disposed above the second peripheral circuit ground line.

13. A method of fabricating a semiconductor memory device comprising a pseudo ground voltage pad, the method comprising:
    forming a plurality of pads, wherein the plurality of pads comprises a plurality of ground voltage pads and a plurality of data pads, and wherein the plurality of pads are arranged in a first direction;
    forming a peripheral circuit ground line laterally adjacent to each pad of the plurality of pads, wherein the peripheral circuit ground line extends in the first direction; and,
    forming an insulating layer over a first region of the peripheral circuit ground line and a first region of each pad of the plurality of pads, and exposing a second region of the peripheral circuit ground line and a second region of each pad of the plurality of pads, wherein the exposed second region of the peripheral circuit ground line is the pseudo ground voltage pad and is disposed adjacent to one of the plurality of data pads.

14. The method of claim 13, wherein:

the insulating layer exposes a plurality of second regions of the peripheral circuit ground line to define a plurality of pseudo ground voltage pads;

the plurality of data pads comprises a plurality of first data pads and a plurality of second data pads, and each one of the plurality of first data pads is not adjacent to any one of the plurality of ground voltage pads, and each one of the plurality of second data pads is adjacent to at least one of the plurality of ground voltage pads.

15. The method of claim 14, wherein each one of the plurality of first data pads is adjacent to at least one of the plurality of pseudo ground voltage pads.

16. The method of claim 15, wherein at least one of the plurality of second data pads is adjacent to at least one of the plurality of pseudo ground voltage pads.

17. The method of claim 14, wherein every one of the first and second data pads is adjacent to at least one of the plurality of pseudo ground voltage pads.

18. The method of claim 13, wherein a first separation distance between the peripheral circuit ground line and any one of the plurality of pads is substantially the same as a second separation distance between any two adjacent ones of the plurality of pads.

* * * * *